United States Patent
Kobayashi et al.

(10) Patent No.: US 11,831,292 B2
(45) Date of Patent: Nov. 28, 2023

(54) LC COMPOSITE COMPONENT AND COMMUNICATION TERMINAL DEVICE

(71) Applicant: Murata Manufacturing Co., Ltd., Nagaokakyo (JP)

(72) Inventors: Hideaki Kobayashi, Nagaokakyo (JP); Kenichi Ishizuka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 244 days.

(21) Appl. No.: 17/356,572

(22) Filed: Jun. 24, 2021

(65) Prior Publication Data
US 2021/0351757 A1    Nov. 11, 2021

Related U.S. Application Data

(63) Continuation of application No. PCT/JP2019/049719, filed on Dec. 19, 2019.

(30) Foreign Application Priority Data

Jan. 17, 2019  (JP) .................................. 2019-005682

(51) Int. Cl.
*H03H 7/01* (2006.01)

(52) U.S. Cl.
CPC ........ *H03H 7/1766* (2013.01); *H03H 7/0115* (2013.01); *H03H 7/1791* (2013.01)

(58) Field of Classification Search
CPC .................... H03H 2001/0085; H03H 7/0115
USPC ................................................. 333/175, 185
See application file for complete search history.

(56) References Cited

U.S. PATENT DOCUMENTS

| | | | |
|---|---|---|---|
| 6,133,809 | A | 10/2000 | Tomohiro et al. |
| 2003/0095016 | A1 | 5/2003 | Azuma et al. |
| 2012/0313729 | A1 | 12/2012 | Togashi |

(Continued)

FOREIGN PATENT DOCUMENTS

| | | |
|---|---|---|
| JP | 07-192972 A | 7/1995 |
| JP | 09-293612 A | 11/1997 |
| JP | 2003-152490 A | 5/2003 |

(Continued)

OTHER PUBLICATIONS

Official Communication issued in International Patent Application No. PCT/JP2019/049719, dated Mar. 10, 2020.

*Primary Examiner* — Rakesh B Patel
(74) *Attorney, Agent, or Firm* — KEATING & BENNETT, LLP

(57) ABSTRACT

An LC composite component includes a multilayer body including insulating base members that are laminated and include insulating base members on which conductor patterns are provided. Capacitor conductor patterns are provided on insulating base members different from an insulating base member on which a coil conductor pattern is provided, and each include an extending portion overlapping with a line segment connecting a center of a first terminal and a center of a second terminal in a shortest distance as viewed in the lamination direction and projecting portions projecting in directions different from the direction of the line segment, and the projecting portions overlap with linear portions of the coil conductor pattern without overlapping with bent portions thereof as viewed in the lamination direction.

21 Claims, 16 Drawing Sheets

(56) References Cited

U.S. PATENT DOCUMENTS

2015/0214916 A1* 7/2015 Park .................... H03H 7/0115
333/172
2018/0069524 A1 3/2018 Ishizuka

FOREIGN PATENT DOCUMENTS

| JP | 2005-260343 A | 9/2005 |
| JP | 2012-256757 A | 12/2012 |
| JP | 6183566 B2 | 8/2017 |

* cited by examiner

LC COMPOSITE COMPONENT AND COMMUNICATION TERMINAL DEVICE

CROSS REFERENCE TO RELATED APPLICATIONS

This application claims the benefit of priority to Japanese Patent Application No. 2019-005682 filed on Jan. 17, 2019 and is a Continuation Application of PCT Application No. PCT/JP2019/049719 filed on Dec. 19, 2019. The entire contents of each application are hereby incorporated herein by reference.

BACKGROUND OF THE INVENTION

1. Field of the Invention

The present invention relates to an LC composite component provided in a high-frequency circuit, and particularly, to an LC composite component including a coil and a capacitor provided in a multilayer body including insulating base members, and a communication terminal device including the same.

2. Description of the Related Art

When, for example, an LC filter, an impedance matching circuit, a phase shifter, and the like are configured as single components, each of them may be configured by an LC composite component in which a coil and a capacitor are formed in a single multilayer body.

In communication terminal devices and the like including a cellular phone terminal, it is often necessary to achieve impedance matching in a plurality of frequency bands. For example, as illustrated in FIG. 19, when a phase shifter 73 is provided between an impedance matching circuit 72 and a second high-frequency circuit 74 and impedance matching between a first high-frequency circuit 71 and the second high-frequency circuit 74 is performed by the phase shifter 73 and the impedance matching circuit 72, the phase shifter is required to have phase shift characteristics corresponding to frequency bands for the impedance matching in a plurality of frequency bands.

For example, Japanese Patent No. 6183566 discloses a transformer-type phase shifter enabling phase shift corresponding to a frequency by including a first coil connected between a first port and the ground, a second coil that is connected between a second port and the ground and provides magnetic field coupling with the first coil, and a capacitor connected between the first port and the second port.

When the transformer-type phase shifter described in Japanese Patent No. 6183566 is configured as a multilayer chip component, it is important to suppress interference between coil conductor patterns configuring coils of a transformer and a capacitor conductor pattern configuring the capacitor.

For example, FIG. 20A is a cross-sectional view of a phase shifter that is to be configured as a multilayer chip component, and FIG. 20B is a plan view of a capacitor conductor pattern provided in the multilayer body. In this example, a conductor pattern for a first coil L1, a conductor pattern for a second coil L2, and a conductor pattern for a capacitor C are provided inside the multilayer body.

The capacitor C needs to have a certain degree of capacitance to compensate for the amount of phase shift by the transformer. However, when the area of the capacitor conductor pattern is increased, the capacitor conductor pattern interferes with magnetic fluxes of the transformer. For this reason, as illustrated in FIG. 20A, a gap GAP between the transformer (the conductor pattern for the second coil L2 in the example of FIG. 20A) and the conductor pattern for the capacitor C in the lamination direction is sufficiently increased. In FIG. 20A, broken lines represent schematic paths of the magnetic fluxes.

FIG. 21A is a cross-sectional view of a phase shifter different from that in FIG. 20A, and FIG. 21B is a plan view of a capacitor conductor pattern provided in a multilayer body. When there is a limitation on a chip size and the above-described gap GAP is not sufficiently large, as illustrated in FIG. 21B, it is likely that the capacitor conductor pattern is shaped to have an electrode opening H and a notch N having shapes conforming to a coil shape. With this shape, the transformer can be less influenced by the capacitor C. In FIG. 21A, broken lines represent schematic paths of magnetic fluxes.

However, in the capacitor conductor pattern having such a shape, a current path with a narrow line width is generated as indicated by arrows in FIG. 21B, and the ESL (equivalent series inductance) of the capacitor is therefore increased. As a result, predetermined phase-to-frequency characteristics cannot be obtained.

Although the above-described example is for the LC composite component used as the phase shifter, it is important to suppress interference between a coil and a capacitor in an LC composite component in which the coil and the capacitor are provided in the multilayer body without being limited to the phase shifter.

SUMMARY OF THE INVENTION

Preferred embodiments of the present invention provide LC composite components that each achieve miniaturization while reducing or preventing interference between a coil conductor pattern and a capacitor conductor pattern.

An LC composite component according to a preferred embodiment of the present invention includes a multilayer body including a plurality of insulating base members that are laminated and include a plurality of insulating base members on which conductor patterns are respectively provided; and a first terminal and a second terminal along two sides of the multilayer body, which face each other as viewed in a lamination direction of the plurality of insulating base members, wherein the conductor patterns include a coil conductor pattern and a capacitor conductor pattern, the coil conductor pattern includes a plurality of linear portions and a plurality of bent portions at positions winding around a coil opening, the capacitor conductor pattern includes a first capacitor conductor pattern that conducts to the first terminal and a second capacitor conductor pattern that conducts to the second terminal and faces the first capacitor conductor pattern in the lamination direction, the first capacitor conductor pattern and the second capacitor conductor pattern are provided on insulating base members different from an insulating base member on which the coil conductor pattern is provided among the plurality of insulating base members and each of the first capacitor conductor pattern and the second capacitor conductor pattern includes an extending portion overlapping with a line segment connecting a center of the first terminal and a center of the second terminal in a shortest distance as viewed in the lamination direction and a projecting portion projecting in a direction different from a direction of the line segment, and the projecting portion overlaps with the linear portion of the coil conductor pattern without overlapping with the bent portions of the coil conductor pattern as viewed in the lamination direction.

An LC composite component according to a preferred embodiment of the present invention includes a multilayer body including a plurality of insulating base members that are laminated and include a plurality of insulating base members on which conductor patterns are respectively provided; and a first terminal and a second terminal along two sides of the multilayer body, which face each other as viewed in a lamination direction of the plurality of insulating base members, wherein the conductor patterns include a coil conductor pattern and a capacitor conductor pattern, the coil conductor pattern includes a plurality of linear portions and a plurality of bent portions at positions winding around a coil opening, the capacitor conductor pattern includes a first capacitor conductor pattern that conducts to the first terminal and a second capacitor conductor pattern that conducts to the second terminal and faces the first capacitor conductor pattern in the lamination direction, the first capacitor conductor pattern and the second capacitor conductor pattern are provided on insulating base members different from an insulating base member on which the coil conductor pattern is provided among the plurality of insulating base members and each of the first capacitor conductor pattern and the second capacitor conductor pattern includes an extending portion overlapping with a line segment connecting a center of the first terminal and a center of the second terminal in a shortest distance as viewed in the lamination direction and a projecting portion projecting in a direction different from a direction of the line segment, and the projecting portion is closer to the linear portion of the coil conductor pattern than to the bent portion as viewed in the lamination direction.

A communication terminal device according to a preferred embodiment of the present invention includes a power supply circuit, an antenna connected to the power supply circuit, and an LC composite component according to a preferred embodiment of the present invention provided between the power supply circuit and the antenna, the LC composite component including a ground terminal provided on the multilayer body, wherein the coil conductor pattern includes a first coil conductor pattern defining a first coil and a second coil conductor pattern defining a second coil that provides magnetic field coupling with the first coil, the first coil is connected between the first terminal and the ground terminal, and the second coil is connected between the second terminal and the ground terminal.

A communication terminal device according to a preferred embodiment of the present invention includes two input/output terminals, a signal line connecting the two input/output terminals, and a series circuit including an LC composite component according to a preferred embodiment of the present invention and an LC resonance circuit in a shunt connection path between the signal line and ground.

According to preferred embodiments of the present invention, it is possible to obtain LC composite components that each achieve miniaturization while reducing or preventing interference between a coil conductor pattern and a capacitor conductor pattern.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
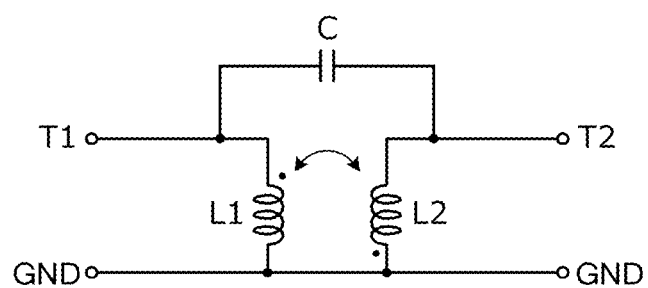
FIG. 1 is a circuit diagram of a phase shifter 101 according to a first preferred embodiment of the present invention.

First, some features of phase shifters and communication terminal devices according to preferred embodiments of the present invention will be described. The phase shifters are examples of LC composite components.

An LC composite component according to a preferred embodiment of the present invention includes a multilayer body having a rectangular or substantially rectangular parallelepiped shape including a plurality of insulating base members that are laminated and include a plurality of insulating base members on which conductor patterns are respectively provided, and a first terminal and a second terminal along two sides of the multilayer body, which face each other as viewed in a lamination direction of the plurality of insulating base members. Further, the conductor patterns include a coil conductor pattern and a capacitor conductor pattern, the coil conductor pattern includes a plurality of linear portions and a plurality of bent portions at positions winding around a coil opening, the capacitor conductor pattern includes a first capacitor conductor pattern that conducts to the first terminal and a second capacitor conductor pattern that conducts to the second terminal and faces the first capacitor conductor pattern in the lamination direction.

The first capacitor conductor pattern and the second capacitor conductor pattern are provided on insulating base members different from an insulating base member on which the coil conductor pattern is provided among the plurality of insulating base members and each of the first capacitor conductor pattern and the second capacitor conductor pattern includes an extending portion overlapping with a line segment connecting a center of the first terminal and a center of the second terminal in a shortest distance as viewed in the lamination direction and a projecting portion projecting in a direction different from a direction of the line segment, and the projecting portion overlaps with the linear portion of the coil conductor pattern without overlapping with the bent portion of the coil conductor pattern as viewed in the lamination direction.

With this configuration, a large area of the capacitor conductor pattern can be provided, and magnetic fluxes interlinked with the first coil conductor pattern and the second coil conductor pattern are less likely to be hindered by the capacitor conductor pattern.

In an LC composite component according to a preferred embodiment of the present invention, when the projecting portion does not overlap with the linear portion as viewed in the lamination direction, the projecting portion is closer to the linear portion of the first coil conductor pattern or the second coil conductor pattern than to the bent portion. With this configuration, the magnetic fluxes interlinked with the first coil conductor pattern and the second coil conductor pattern are less likely to be hindered by the capacitor conductor pattern. Further, parasitic capacitance that is generated between the first coil conductor pattern and the second coil conductor pattern and the capacitor conductor pattern is reduced or prevented.

In an LC composite component according to a preferred embodiment of the present invention, a plurality of the projecting portions are provided.

In an LC composite component according to a preferred embodiment of the present invention, a straight line indicating a projecting direction of the projecting portion passes through a center of the line segment as viewed in the lamination direction. With this configuration, since the capacitor conductor pattern is provided at a position where a magnetic flux density by the first coil conductor pattern and the second coil conductor pattern is relatively low, interference between the first coil conductor pattern and the second coil conductor pattern and the capacitor conductor pattern is effectively reduced or prevented.

In an LC composite component according to a preferred embodiment of the present invention, a width of the capacitor conductor pattern in a direction orthogonal or substantially orthogonal to the line segment is smaller in a portion that is directly connected to the first terminal or the second terminal than in the projecting portion. With this configuration, since the capacitor conductor pattern is shaped to project from the center of the line segment rather than end portions of the line segment, the capacitor conductor pattern is located only at a position where the magnetic flux density by the first coil conductor pattern and the second coil conductor pattern is relatively low. Therefore, the interference between the first coil conductor pattern and the second coil conductor pattern and the capacitor conductor pattern can be effectively reduced or prevented.

In an LC composite component according to a preferred embodiment of the present invention, the capacitor conductor pattern is symmetrical or substantially symmetrical with respect to the line segment. With this configuration, since the capacitor conductor pattern is disposed at a position where the magnetic flux density by the first coil conductor pattern and the second coil conductor pattern is relatively low, the interference between the first coil conductor pattern and the second coil conductor pattern and the capacitor conductor pattern is effectively reduced or prevented.

In an LC composite component according to a preferred embodiment of the present invention, the projecting portion projects linearly in a direction orthogonal or substantially orthogonal to the line segment as viewed in the lamination direction. With this configuration, the interference between the first coil conductor pattern and the second coil conductor pattern and the capacitor conductor pattern is effectively reduced or prevented.

In an LC composite component according to a preferred embodiment of the present invention, the projecting portion has a width in a direction orthogonal or substantially orthogonal to the line segment that increases continuously from the first terminal and the second terminal to a center of the line segment as viewed in the lamination direction. With this configuration, the capacitor conductor pattern having an area as wide as possible is provided while avoiding portions where the magnetic flux densities by the first coil conductor pattern and the second coil conductor pattern are high.

In an LC composite component according to a preferred embodiment of the present invention, the projecting portion includes a portion corresponding to a center of the line segment that has a curvature (a rounded shape) as viewed in the lamination direction. With this configuration, the capacitor conductor pattern can be provided while avoiding portions having higher magnetic flux densities in comparison with the case where projecting portions having rectangular or substantially rectangular shapes having the same areas are provided.

An LC composite component according to a preferred embodiment of the present invention includes a ground terminal on the multilayer body, in which the coil conductor pattern includes a first coil conductor pattern defining a first coil and a second coil conductor pattern defining a second coil that provides magnetic field coupling with the first coil, the first coil is connected between the first terminal and the ground terminal, and the second coil is connected between the second terminal and the ground terminal. With this configuration, the LC composite component defines and functions as a phase shifter that shifts a signal between the first terminal and the second terminal by a predetermined amount.

A communication terminal device according to a preferred embodiment of the present invention includes a power supply circuit, and an antenna connected to the power supply circuit, in which an LC composite component is provided between the power supply circuit and the antenna. With this configuration, it is possible to provide a communication terminal device including the antenna matching over a wide band.

A communication terminal device according to a preferred embodiment of the present invention includes two input/output terminals, a signal line connecting the two input/output terminals, and a series circuit of an LC composite component and an LC resonance circuit in a shunt connection path between the signal line and the ground. With this configuration, a frequency at which the LC resonance circuit defines and functions as a trap filter can be determined in accordance with a phase shift amount and frequency characteristics of the LC composite component.

A communication terminal device according to a preferred embodiment of the present invention includes an amplifier connected to the signal line. With this configuration, it is possible to selectively reduce or prevent unnecessary frequency components of a predetermined frequency that are generated by the amplifier.

Hereinafter, preferred embodiments of the present invention will be described using several specific examples with reference to the drawings. In the drawings, the same reference numerals denote the same or corresponding element and portions. In consideration of ease of explanation of main points and understanding, preferred embodiments of the present invention are described separately for the convenience of explanation, but partial substitutions or combinations of configurations described in different preferred embodiments can be made. In second and subsequent preferred embodiments, description of matters common to those in a first preferred embodiment will be omitted, and only different points will be described. In particular, similar advantageous effects with the same or similar configurations will not be described in detail for each preferred embodiment.

First Preferred Embodiment

FIG. 1 is a circuit diagram of a phase shifter 101 according to a first preferred embodiment of the present invention. The phase shifter 101 includes a first coil L1 connected between a first terminal T1 and a ground terminal GND, a second coil L2 connected between a second terminal T2 and the ground terminal GND and providing magnetic field coupling with the first coil L1, and a capacitor C connected between the first terminal T1 and the second terminal T2.

Figure 2:
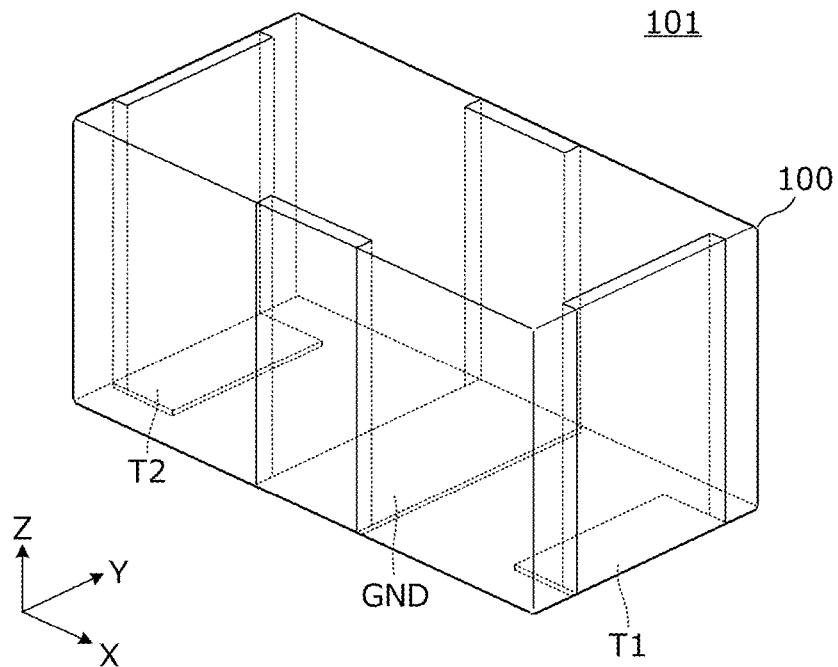
FIG. 2 is an external perspective view of the phase shifter 101.
Figure 3:
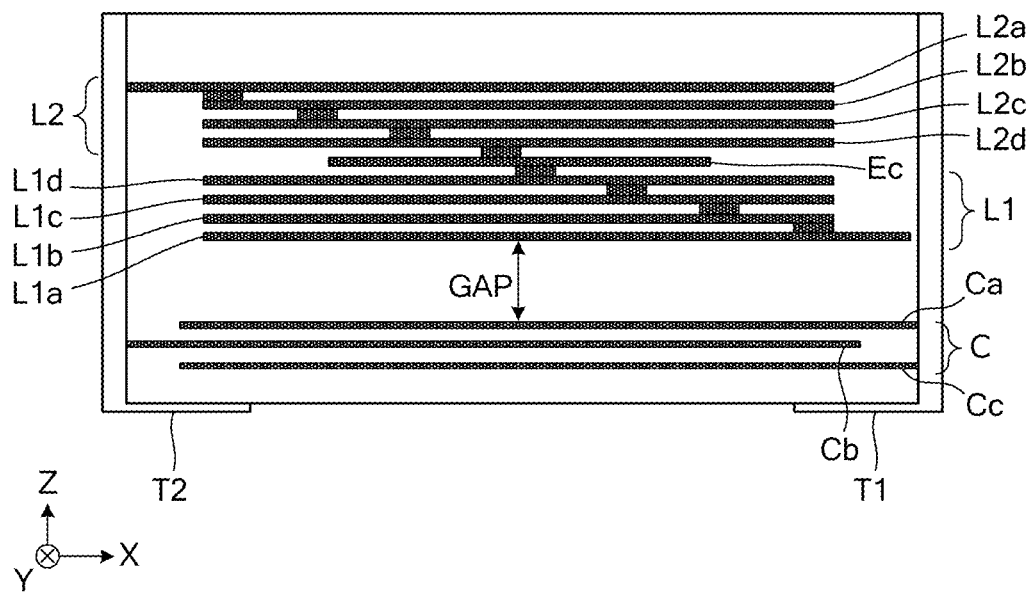
FIG. 3 is a front view of the phase shifter 101 as viewed in a Y direction in FIG. 2.

FIG. 2 is an external perspective view of the phase shifter 101. FIG. 3 is a front view of the phase shifter 101 as viewed in a Y direction in FIG. 2. Note that FIG. 3 illustrates the inside of the phase shifter 101 in a see-through manner.

The phase shifter 101 includes a plurality of insulating base members that are laminated and include an insulating base member on which a first coil conductor pattern defining the first coil is provided, an insulating base member on which a second coil conductor pattern defining the second coil is provided, and an insulating base member on which a capacitor conductor pattern configuring a capacitor is provided. A multilayer body 100 illustrated in FIG. 2 includes the plurality of insulating base members. The first terminal T1, the second terminal T2, and the ground terminal GND are provided on the outer surfaces of the multilayer body 100.

The first terminal T1 and the second terminal T2 are provided at both ends of the multilayer body 100 in an X-axis direction in an X, Y, and Z orthogonal system illustrated in FIGS. 2 and 3. Further, a conductor film to conduct the first terminals T1 provided on the respective insulating base members in a lamination direction (Z), a conductor film to conduct the second terminals T2 provided on the respective insulating base members in the lamination direction, and a conductor film to conduct the ground terminals GND provided on the respective insulating base members in the lamination direction are provided on the side surfaces of the multilayer body 100.

As illustrated in FIG. 3, the first coil L1 includes first coil conductor patterns L1a to L1d and via conductors connecting them to each other, and the second coil L2 includes second coil conductor patterns L2a to L2d and via conductors connecting them to each other. Further, the capacitor C includes first capacitor conductor patterns Ca and Cc and a second capacitor conductor pattern Cb.

Figure 4:
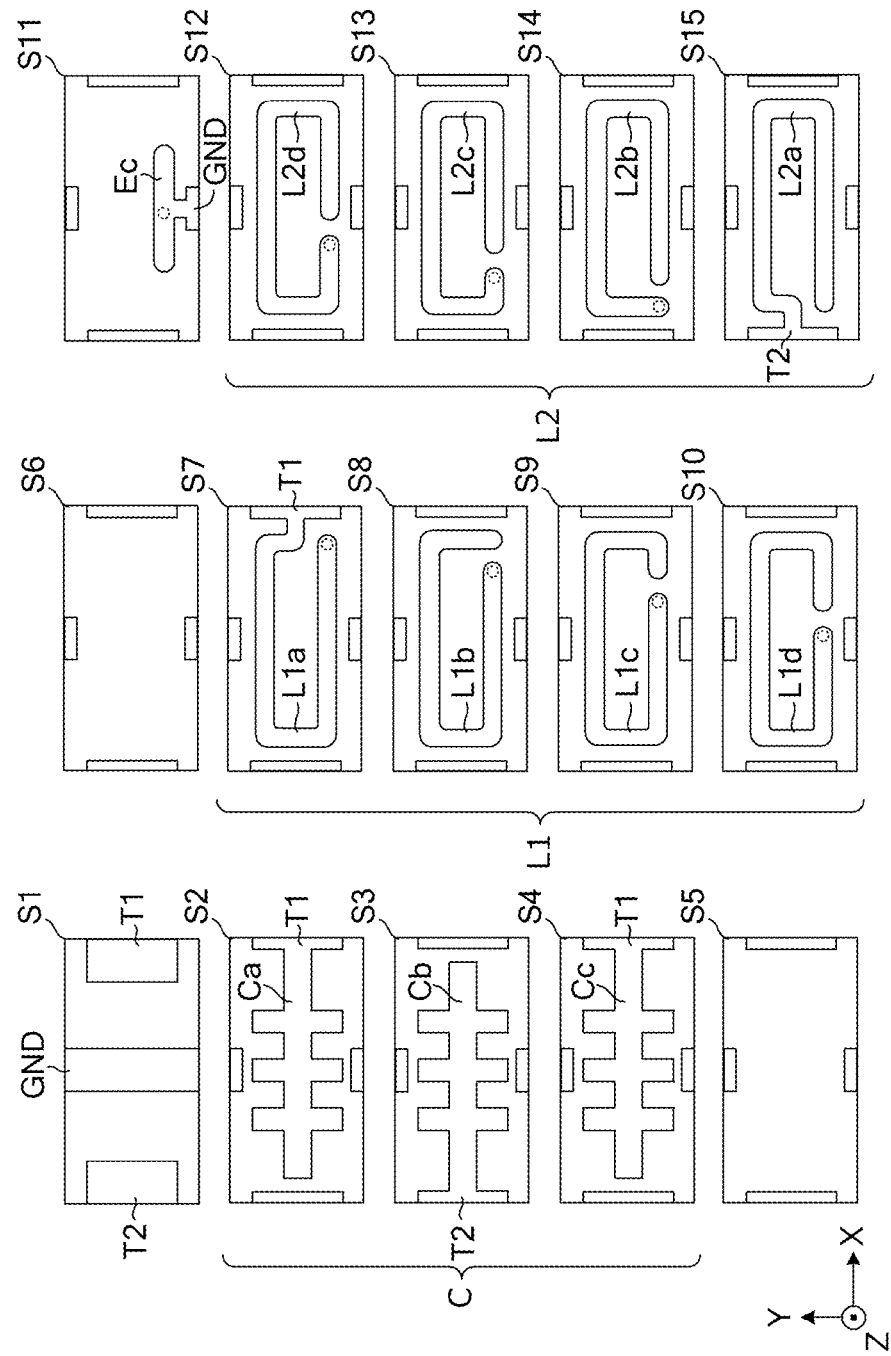
FIG. 4 is a plan view of each of a plurality of insulating base members of the phase shifter 101.

FIG. 4 is a plan view of each of the plurality of insulating base members of the phase shifter 101. The multilayer body 100 of the phase shifter 101 includes insulating base members S1 to S15. FIG. 4 illustrates bottom views of all of the insulating base members S1 to S15.

The first coil conductor patterns L1a to L1d are respectively provided on the insulating base members S7 to S10. The second coil conductor patterns L2a to L2d are respectively provided on the insulating base members S12 to S15. The capacitor conductor patterns Ca, Cb, and Cc are respectively provided on the insulating base members S2 to S4. The insulating base members S5 and S6 are provided as spacers. That is, a predetermined gap is provided between the first coil conductor patterns L1a to L1d and the second coil conductor patterns L2a to L2d and the capacitor conductor patterns Ca, Cb, and Cc.

Terminal conductor patterns including the first terminal T1, the second terminal T2, and the ground terminal GND are provided on all of the insulating base members S1 to S15. In other words, the coil conductor pattern or the capacitor conductor pattern and the terminal conductor patterns are provided on the same plane of each insulating base member. This is due to a manufacturing method of the phase shifter in the present preferred embodiment.

Specifically, the phase shifter is manufactured as follows. First, photosensitive conductive pastes are applied, by screen printing, for example, onto an insulating base member formed by applying insulating pastes, and a coil conductor pattern or a capacitor conductor pattern and terminal conductor patterns are formed on each insulating base member by a photolithography process, for example. Photosensitive insulating pastes are then screen-printed to form openings and a via hole (opening for forming the via conductor). The photosensitive insulating pastes also form the insulating base member. Thereafter, the photosensitive conductive pastes are screen-printed to form the coil conductor pattern or the capacitor conductor pattern and the terminal conductor patterns by the photolithography process. Accordingly, the terminal conductor patterns are formed in the openings, the via conductor is formed in the via hole, and the coil conductor pattern or the capacitor conductor pattern is formed on the insulating pastes. By repeating the above-described processes, all of the insulating base members include the terminal conductor patterns because terminals of the phase shifter are formed by the plurality of laminated terminal conductor patterns. The method for forming the conductor patterns is not limited to this. For example, a printing lamination method of conductor pastes by a screen plate that opens in a conductor pattern shape may be used. The method for forming external electrodes is not limited to this. For example, the terminal electrodes may be formed by applying conductor pastes onto a multilayer element body by dipping or sputtering, and plating may be performed on the surfaces thereof.

One end of the first coil conductor pattern L1a is connected to the first terminal T1, and one end of the first coil conductor pattern L1d is connected to a ground connection pattern Ec. The ground connection pattern Ec is connected to the ground terminal GND. The first coil conductor pattern L1a and the first coil conductor pattern L1b, the first coil conductor pattern L1b and the first coil conductor pattern L1c, and the first coil conductor pattern L1c and the first coil conductor pattern L1d are connected to each other through the via conductors indicated by small circles with broken lines in FIG. 4.

One end of the second coil conductor pattern L2a is connected to the second terminal T2, and one end of the second coil conductor pattern L2d is connected to the ground connection pattern Ec. The second coil conductor pattern L2a and the second coil conductor pattern L2b, the second coil conductor pattern L2b and the second coil conductor pattern L2c, and the second coil conductor pattern L2c and the second coil conductor pattern L2d are connected to each other through the via conductors indicated by small circles in broken lines in FIG. 4.

Each of one ends of the capacitor conductor patterns Ca and Cc are connected to the first terminal T1, and one end of the capacitor conductor pattern Cb is connected to the second terminal T2.

Figure 5A:
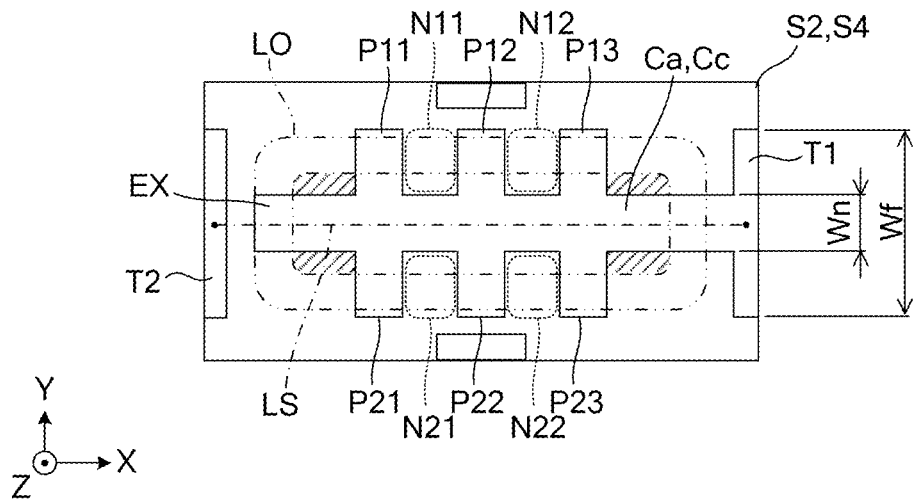
FIGS. 5A and 5B are plan views illustrating a relationship between capacitor conductor patterns and coil conductor patterns.
Figure 5B:
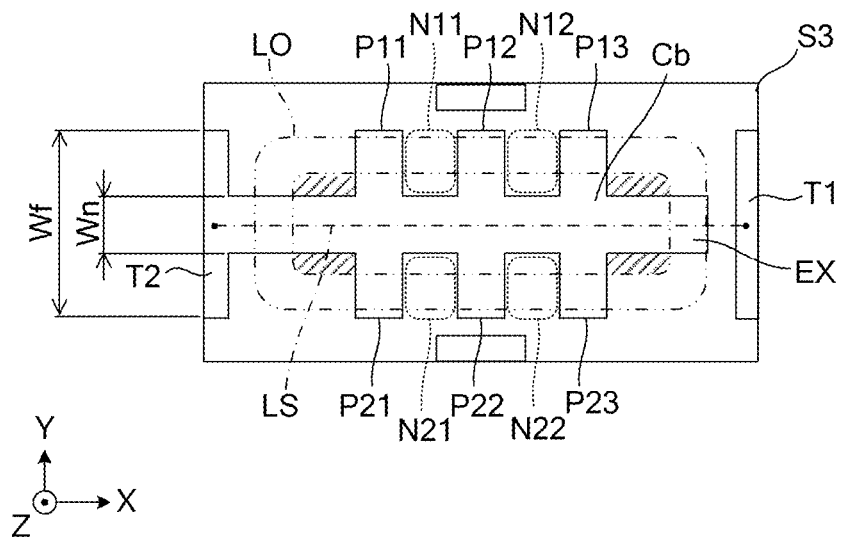
Figure 6A:
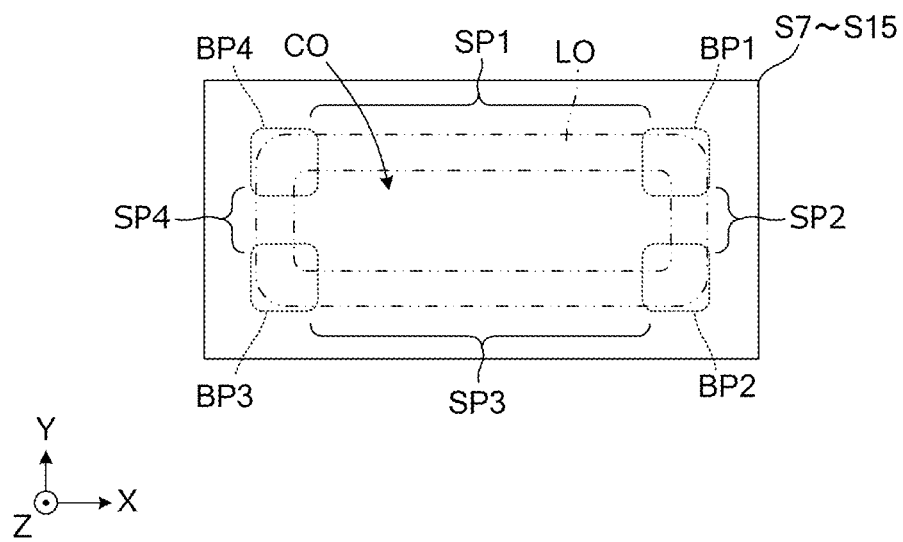
FIGS. 6A and 6B are plan views illustrating the coil conductor patterns.
Figure 6B:
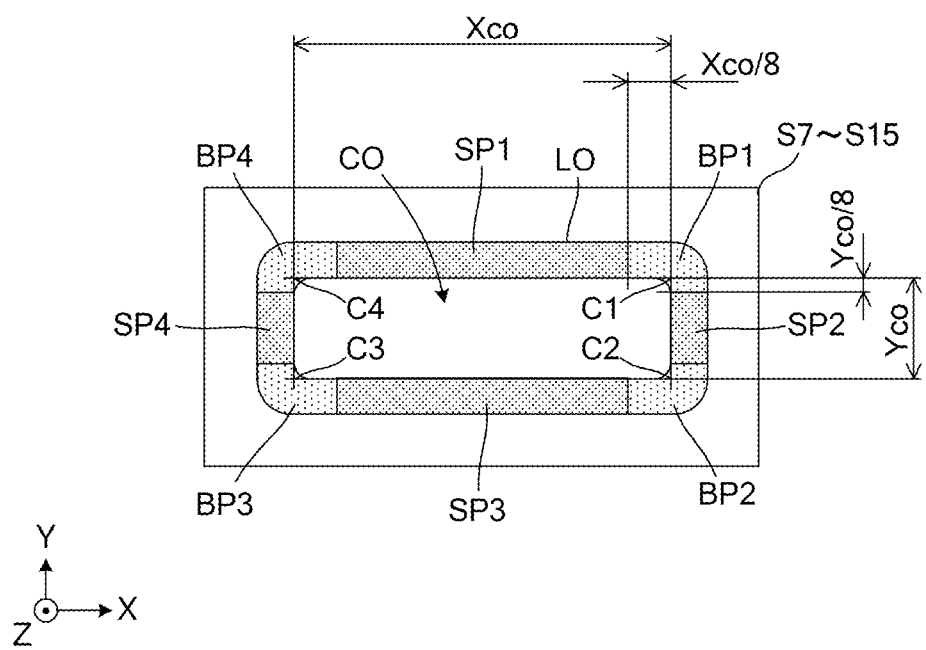
Figure 7A:
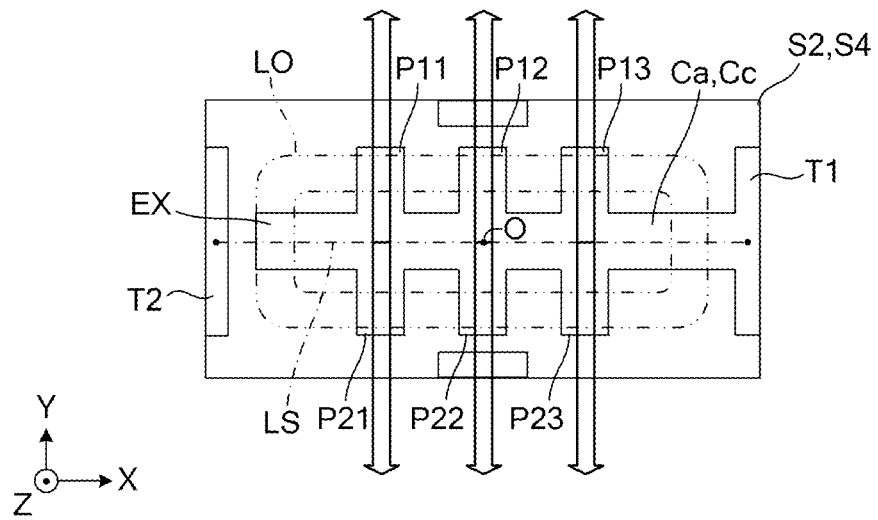
FIGS. 7A and 7B are plan views illustrating projecting portions of the capacitor conductor patterns.
Figure 7B:
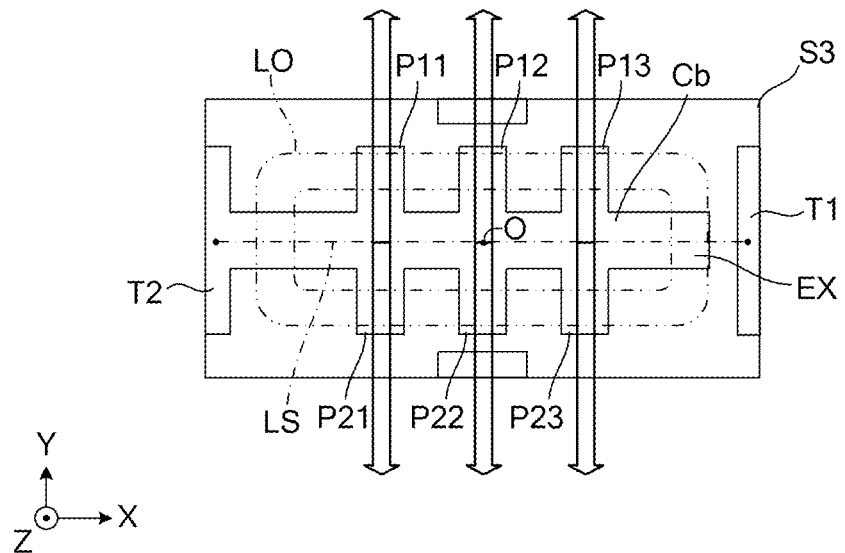

FIGS. 5A and 5B are plan views illustrating a relationship between the capacitor conductor patterns and the coil conductor patterns. FIGS. 7A and 7B are plan views illustrating projecting portions of the capacitor conductor patterns. FIGS. 6A and 6B are plan views illustrating the coil conductor patterns. FIGS. 5A and 5B, FIGS. 6A and 6B, and FIGS. 7A and 7B schematically illustrate a schematic coil conductor pattern LO as a pattern in which the coil conductor patterns L1a to L1d and L2a to L2d are integrated. That is, the planar shape of portions covered by any one of the coil conductor patterns L1a to L1d and L2a to L2d as viewed in the lamination direction is represented as the schematic coil conductor pattern LO. FIG. 5A is a plan view illustrating a relationship between the capacitor conductor patterns Ca and Cc provided on the insulating base members S2 and S4 and the schematic coil conductor pattern LO. FIG. 5B is a plan view illustrating a relationship between the capacitor conductor pattern Cb provided on the insulating base member S3 and the schematic coil conductor pattern LO.

As illustrated in FIG. 6A, in the phase shifter 101 in the present preferred embodiment, the first coil conductor patterns L1a to L1d and the second coil conductor patterns L2a to L2d include linear portions SP1, SP2, SP3, and SP4 and bent portions BP1, BP2, BP3, and BP4 at positions winding around a coil opening CO. The bent portions BP1, BP2, BP3, and BP4 are defined as follows.

As illustrated in FIG. 6A, the bent portions BP1, BP2, BP3, and BP4 are curved portions of the schematic coil conductor pattern LO. More specifically, it is preferable that the bent portions BP1, BP2, BP3, and BP4 be defined as follows. First, the length of the coil opening CO in the X direction is represented by Xco, and the length thereof in the Y direction is represented by Yco. Two sides of the coil opening CO (the inner circumference of the schematic coil conductor pattern LO) in the X direction are extended in the X direction, two sides thereof in the Y direction are extended in the Y direction, and intersection points between the two straight lines extending in the X direction and the two straight lines extending in the Y direction are defined as corner portions C1, C2, C3, and C4 (FIG. 6B). A position advanced by Xco/8 in the direction toward the corner portion C4 from the corner portion C1 is defined as a boundary between the bent portion BP1 and the linear portion SP1. Further, a position advanced by Yco/8 in the direction toward the corner portion C2 from the corner portion C1 is defined as a boundary between the bent portion BP1 and the linear portion SP2. The other bent portions BP2, BP3, and BP4 are also defined in the same or substantially the same manner. In this way, in the example illustrated in FIG. 6B, the schematic coil conductor pattern LO includes four I-shaped linear portions SP1 to SP4 and four J-shaped bent portions BP1 to BP4.

As illustrated in FIGS. 5A and 5B, the capacitor conductor patterns Ca, Cb, and Cc are the plurality of conductor patterns facing each other in the lamination direction of the plurality of insulating base members, and each of the capacitor conductor patterns Ca, Cb, and Cc includes an extending portion EX overlapping with a line segment LS connecting the center of the first terminal T1 and the center of the second terminal T2 in the shortest distance as viewed in the lamination direction, and projecting portions P11, P12, P13, P21, P22, and P23 projecting in the directions different from the direction of the line segment LS.

When the "projecting portion" is defined with reference to FIGS. 7A and 7B, the projecting portion is a portion projecting from the line segment LS in a direction different from the direction of the line segment LS connecting the center of the first terminal T1 and the center of the second terminal T2 in the shortest distance as viewed in the lamination direction (Z direction) of the insulating base members. In the present preferred embodiment, as illustrated in FIGS. 7A and 7B, three projecting portions P11, P12, and P13 projecting from the line segment LS in the +Y direction (direction orthogonal or substantially orthogonal to the direction of the line segment LS) and three projecting portions P21, P22, and P23 projecting from the line segment LS in the −Y direction (direction orthogonal or substantially orthogonal to the direction of the line segment LS) are provided. In particular, straight lines indicating the projecting directions of the projecting portions P12 and P22 pass through a center O of the line segment LS.

The projecting portions P11, P12, P13, P21, P22, and P23 overlap with the linear portions SP1, SP2, SP3, and SP4 of the coil conductor patterns without overlapping with the bent portions BP1, BP2, BP3, and BP4 thereof as viewed in the lamination direction.

Each of the capacitor conductor patterns Ca, Cb, and Cc includes the extending portion EX overlapping with the line segment LS connecting the center of the first terminal T1 and the center of the second terminal T2 in the shortest distance as viewed in the lamination direction and the projecting portions P11, P12, P13, P21, P22, and P23 projecting in the direction different from the direction of the line segment LS can also be expressed that notches N11, N12, N21, and N22 are provided in each of the capacitor conductor patterns Ca, Cb, and Cc.

In FIGS. 5A and 5B, hatched portions indicate regions that are close to the bent portions BP1, BP2, BP3, and BP4 of the coil conductor patterns illustrated in FIG. 6A and do not overlap with the capacitor conductor patterns Ca, Cb, and Cc. As for the density of magnetic fluxes generated in the coil conductor patterns, the magnetic flux densities of the magnetic fluxes generated in the bent portions BP1, BP2, BP3, and BP4 are higher than the magnetic flux densities of the magnetic fluxes generated in the linear portions SP1, SP2, SP3, and SP4. As described above, the projecting portions of the capacitor conductor patterns avoid portions where the magnetic flux densities are relatively high. In other words, as viewed in the lamination direction, the capacitor conductor patterns do not overlap with the bent portions BP1, BP2, BP3, and BP4 of the first coil conductor patterns or the second coil conductor patterns. Therefore, the magnetic fluxes interlinked with the first coil conductor patterns (L1a to L1d illustrated in FIG. 3) and the second coil conductor patterns (L2a to L2d) are less likely to be hindered by the capacitor conductor patterns Ca, Cb, and Cc.

Further, in the present preferred embodiment, the width of the capacitor conductor patterns Ca, Cb, and Cc in the direction orthogonal or substantially orthogonal to the line segment LS is smaller in portions that are directly connected to the first terminal T1 or the second terminal T2 than in the projecting portions P11, P12, P13, P21, P22, and P23. That is, a width Wn of the portions of the capacitor conductor patterns Ca, Cb, and Cc that are directly connected to the first terminal T1 or the second terminal T2 is smaller than a width Wf of the projecting portions P11, P12, P13, P21, P22, and P23.

In the present preferred embodiment, since the capacitor conductor patterns Ca, Cb and Cc and the first coil conductor patterns L1a to L1d and the second coil conductor patterns L2a to L2d are spaced apart from each other, the magnetic flux densities in the layers in which the capacitor conductor patterns Ca, Cb, and Cc are provided are relatively lower toward the winding axes of the coils. With the above-described configuration, since the capacitor conductor patterns Ca, Cb, and Cc project from positions closer to the center of the line segment rather than end portions thereof, the capacitor conductor patterns Ca, Cb, and Cc are provided only at the positions where the magnetic flux densities by the first coil conductor patterns L1a to L1d and the second coil conductor patterns L2a to L2d are relatively low. Therefore, the interference between the first coil conductor patterns L1a to L1d and the second coil conductor patterns L2a to L2d and the capacitor conductor patterns Ca, Cb, and Cc can be effectively reduced or prevented.

Further, in the present preferred embodiment, the capacitor conductor patterns Ca, Cb, and Cc are symmetrical or substantially symmetrical with respect to the line segment LS. With this configuration, current density distribution can be symmetrical or substantially symmetrical with respect to the line segment LS and current density can be concentrated in the line segment LS as compared to the case where the capacitor conductor patterns Ca, Cb, and Cc are asymmetrical. In other words, when the capacitor conductor patterns Ca, Cb, and Cc are asymmetrical, regions having high current densities deviate from the line segment LS and main current flows through a path longer than the shortest path, resulting in increase of the ESL of the capacitor conductor patterns Ca, Cb, and Cc. Accordingly, when the capacitor conductor patterns Ca, Cb, and Cc are symmetrical or substantially symmetrical with respect to the line segment LS, the ESL of the capacitor can be reduced.

In the present preferred embodiment, since the projecting portions P11, P12, P13, P21, P22, and P23 project linearly in the directions orthogonal or substantially orthogonal to the line segment LS as viewed in the lamination direction, the facing area of the projecting portions and the first coil conductor patterns L1a to L1d and the second coil conductor patterns L2a to L2d are reduced, and the interference between the first coil conductor patterns L1a to L1d and the second coil conductor patterns L2a to L2d and the capacitor conductor patterns Ca, Cb, and Cc is effectively reduced or prevented.

Figure 8:
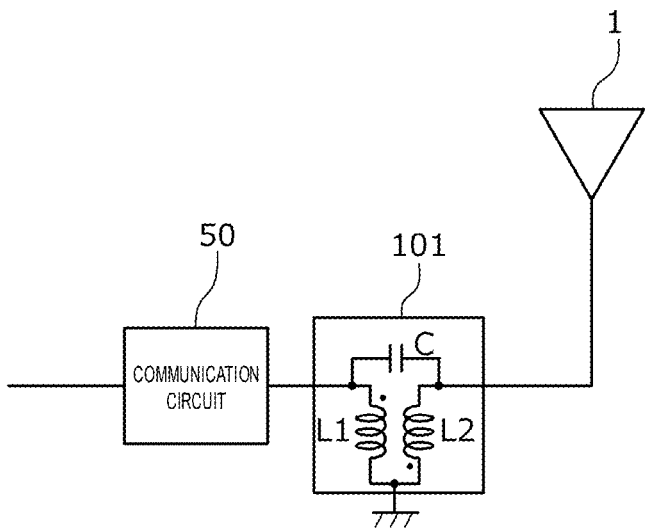
FIG. 8 is a circuit diagram illustrating a configuration of the phase shifter 101 in a communication terminal device.

FIG. 8 is a circuit diagram illustrating a configuration of the phase shifter 101 of the present preferred embodiment in a communication terminal device. In this example, the phase shifter 101 is connected (inserted) between a communication circuit 50 and an antenna 1. The communication circuit 50 corresponds to a "power supply circuit".

Figure 9:
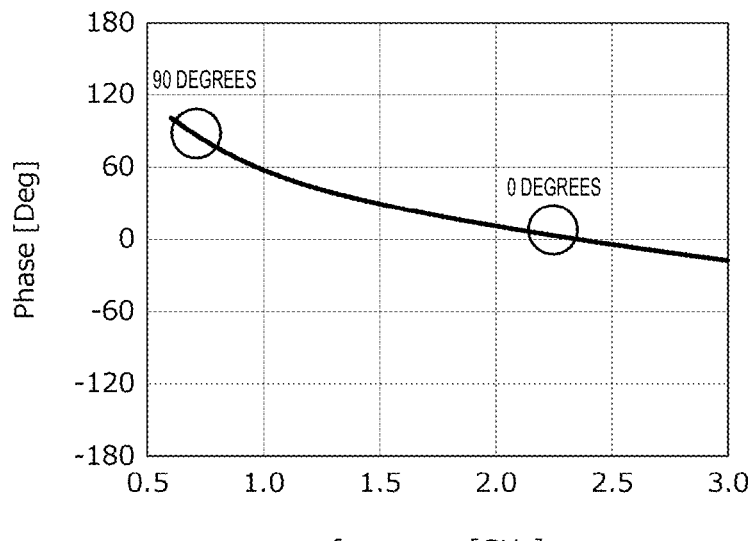
FIG. 9 is a graph illustrating frequency characteristics of the phase shift amount of the phase shifter 101 in FIG. 8.

FIG. 9 is a graph illustrating frequency characteristics of the phase shift amount of the phase shifter 101 in FIG. 8. In this example, the phase shift amount is approximately 90 degrees in a low band (about 700 MHz to about 900 MHz-band) and is approximately 0 degrees in the high band (about 1.7 GHz to about 2.7 GHz-band). That is, the phase shifter 101 illustrated in FIG. 8 shifts a low-band signal by approximately 90 degrees while hardly shifting a high-band signal.

Figure 10:
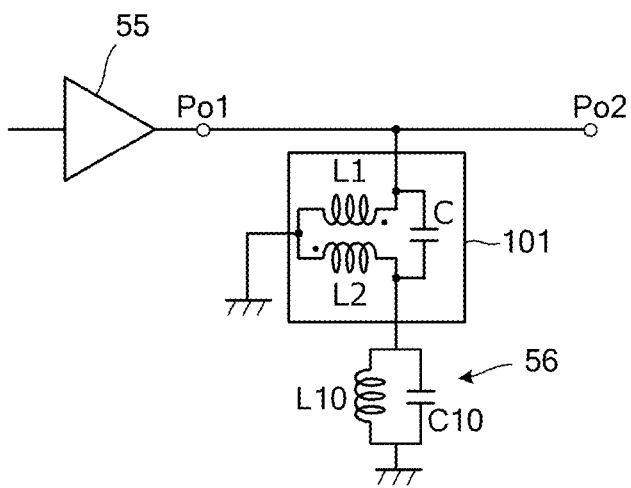
FIG. 10 is a circuit diagram illustrating another configuration of the phase shifter 101 in the communication terminal device.

FIG. 10 is a circuit diagram illustrating another configuration of the phase shifter 101 in a communication terminal device. A circuit illustrated in FIG. 10 includes two input/output terminals Po1 and Po2 and a signal line connecting the two input/output terminals Po1 and Po2, and a series circuit including the phase shifter 101 and an LC parallel resonance circuit 56 is provided in a shunt connection path between the signal line and the ground. The LC parallel resonance circuit 56 is a parallel circuit including an inductor L10 and a capacitor C10. The resonant frequency of the LC parallel resonance circuit 56 is about 2.4 GHz. In the example illustrated in FIG. 10, an amplifier 55 amplifying a high-frequency signal is connected to the input/output terminal Po1.

Figure 11:
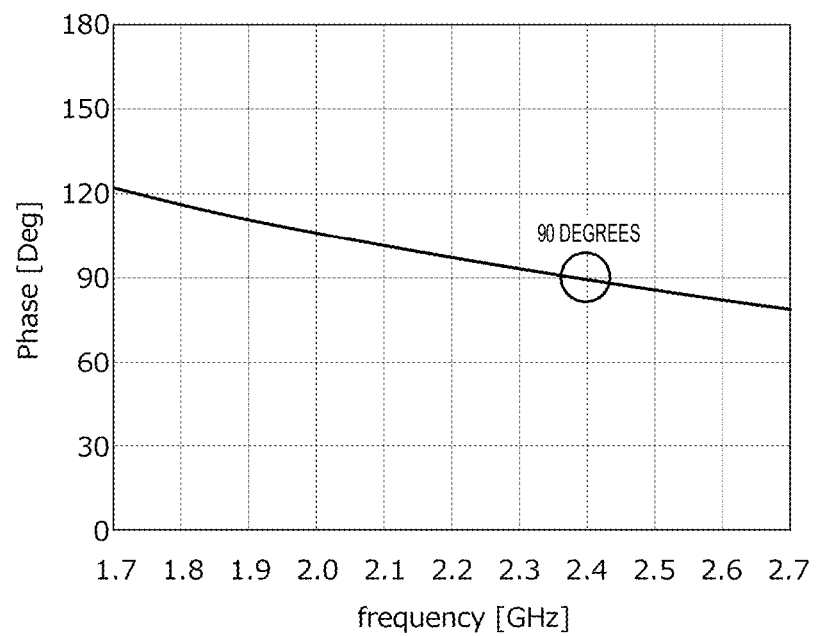
FIG. 11 is a graph illustrating frequency characteristics of the phase shift amount of the phase shifter 101 in FIG. 10.

FIG. 11 is a diagram illustrating frequency characteristics of the phase shift amount of the phase shifter 101 in FIG. 10. In this example, the phase shift amount of the phase shifter 101 is set to be about 90 degrees at about 2.4 GHz. With the shunt connection of the series circuit of the phase shifter 101 and the LC parallel resonance circuit 56 with the resonant frequency of about 2.4 GHz between the signal line and the ground, the impedance when the shunt connection path is seen from the signal line seems to cause short-circuiting at about 2.4 GHz. That is, the shunt connection circuit acts as a trap filter of about 2.4 GHz.

Such a trap filter can selectively reduce or prevent noise components at about 2.4 GHz that are generated by the amplifier 55 connected to one end of the signal line, for example.

As described above, the phase shifter 101 in the present preferred embodiment includes the capacitor electrode with the ESL reduced or prevented, so as to provide a filter in which variations in the frequency characteristics of the phase shift amount are reduced or prevented and that has high accuracy. This is because when the ESL of the capacitor is reduced or prevented, a change in the phase shift amount for the frequency can be reduced (the slope of the shift amount change for the frequency change can be reduced).

Second Preferred Embodiment

In a second preferred embodiment of the present invention, an example in which a relationship between capacitor conductor patterns and coil conductor patterns is different from that in the first preferred embodiment will be described.

Figure 12A:
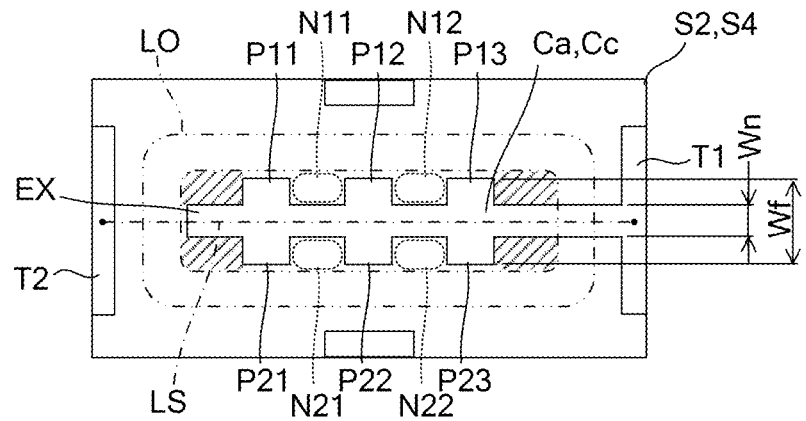
FIGS. 12A and 12B are plan views illustrating a relationship between capacitor conductor patterns and coil conductor patterns.
Figure 12B:
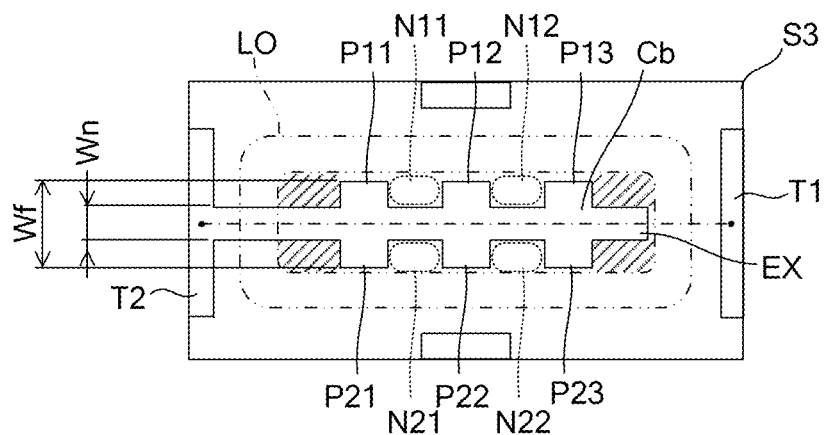
Figure 12C:
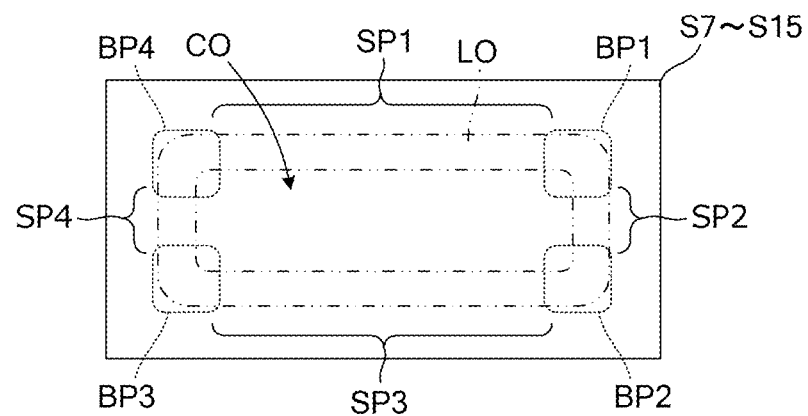
FIG. 12C is a plan view of the schematic coil conductor pattern.

FIGS. 12A and 12B are plan views illustrating the relationship between the capacitor conductor patterns and the coil conductor patterns. FIG. 12C is a plan view of the schematic coil conductor pattern LO in which the coil conductor patterns L1a to L1d and L2a to L2d are integrated for illustration. FIG. 12A is a plan view illustrating a relationship between the capacitor conductor patterns Ca and Cc formed on the insulating base members S2 and S4 and the schematic coil conductor pattern LO. FIG. 12B is a plan view illustrating a relationship between the capacitor conductor pattern Cb formed on the insulating base member S3 and the schematic coil conductor pattern LO.

As is apparent from a comparison with FIGS. 5A and 5B illustrated in the first preferred embodiment, in the second preferred embodiment, the projecting portions P11, P12, P13, P21, P22, and P23 do not overlap with the schematic coil conductor pattern LO (that is, the first coil conductor patterns L1a to L1d and the second coil conductor patterns L2a to L2d described in the first preferred embodiment) as viewed in the lamination direction. The projecting portions P11, P12, P13, P21, P22, and P23 are closer to the linear portions SP1, SP2, SP3, and SP4 of the schematic coil conductor pattern LO than the bent portions BP1, BP2, BP3, and BP4 thereof. More specifically, the tip ends of the projecting portions P11, P12, P13, P21, P22, and P23 are closer to the linear portions SP1, SP2, SP3, and SP4 of the schematic coil conductor pattern LO than the bent portions BP1, BP2, BP3, and BP4 thereof in plan view. In other words, gaps between the bent portions BP1, BP2, BP3, and BP4 of the schematic coil conductor pattern LO and the capacitor conductor patterns Ca, Cb, and Cc are larger than gaps between the linear portions SP1, SP2, SP3, and SP4 of the schematic coil conductor pattern LO and the capacitor conductor patterns Ca, Cb, and Cc thereof. The remaining configurations are the same or substantially the same as those described in the first preferred embodiment.

According to the present preferred embodiment, magnetic fluxes interlinked with the first coil conductor patterns L1a to L1d and the second coil conductor patterns L2a to L2d are less likely to be hindered by the capacitor conductor patterns Ca, Cb, and Cc. Further, parasitic capacitance generated between the first coil conductor patterns L1a to L1d and the second coil conductor patterns L2a to L2d and the capacitor conductor patterns Ca, Cb, and Cc is reduced or prevented. Therefore, interference between the first coil conductor patterns L1a to L1d and the second coil conductor patterns L2a to L2d and the capacitor conductor patterns Ca, Cb, and Cc is effectively reduced or prevented.

Third Preferred Embodiment

In a third preferred embodiment of the present invention, examples of capacitor conductor patterns having a shape different from those of the capacitor conductor patterns, which have been previously described, will be described.

All of FIGS. 13A and 13B, FIGS. 14A and 14B, FIGS. 15A and 15B, FIGS. 16A and 16B, and FIGS. 17A and 17B are plan views illustrating a relationship between the capacitor conductor patterns and coil conductor patterns. FIG. 13A, FIG. 14A, FIG. 15A, FIG. 16A, and FIG. 17A are plan views illustrating a relationship between the capacitor conductor patterns Ca and Cc provided on the insulating base members S2 and S4 and the schematic coil conductor pattern LO. FIG. 13B, FIG. 14B, FIG. 15B, FIG. 16B, and FIG. 17A are plan views illustrating a relationship between the capacitor conductor pattern Cb provided on the insulating base member S3 and the schematic coil conductor pattern LO. As described above, the schematic coil conductor pattern LO is a pattern in which the first coil conductor patterns and the second coil conductor patterns are integrated for illustration. The remaining configurations are the same or substantially the same as those described in the first or second preferred embodiment.

Figure 13A:
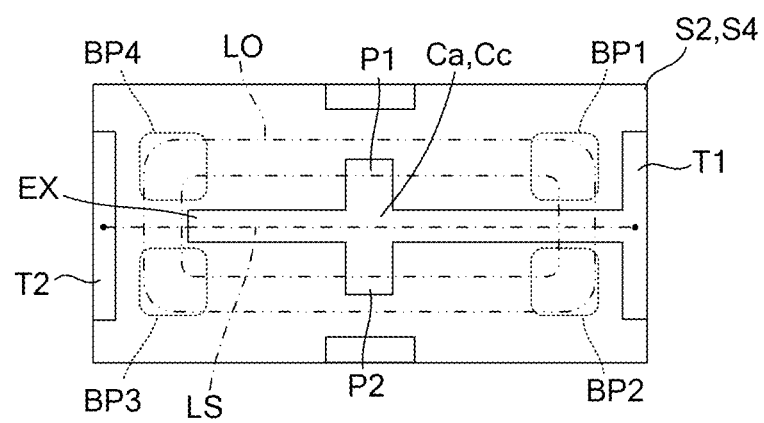
FIGS. 13A and 13B are plan views illustrating a relationship between capacitor conductor patterns and coil conductor patterns of a phase shifter according to a third preferred embodiment of the present invention.
Figure 13B:
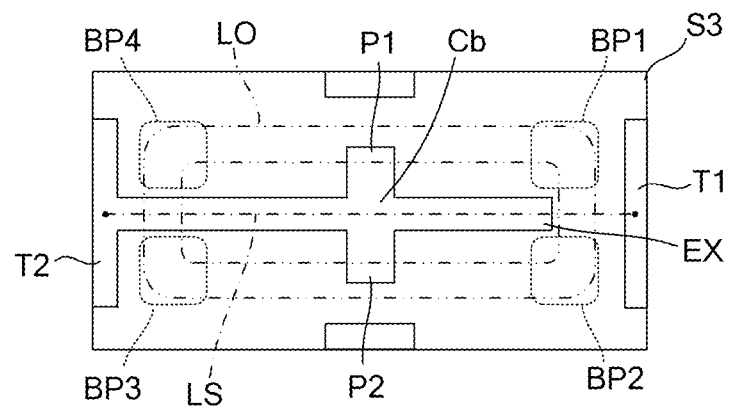

In the example illustrated in FIGS. 13A and 13B, the capacitor conductor patterns Ca, Cb, and Cc include the projecting portions P1 and P2 that project in the directions orthogonal or substantially orthogonal to the direction of the line segment LS connecting the center of the first terminal T1 and the center of the second terminal T2 in the shortest distance as viewed in the lamination direction. As described above, the number of projecting portions may be set such that the projecting portions project one by one in two directions from the line segment LS.

Figure 14A:
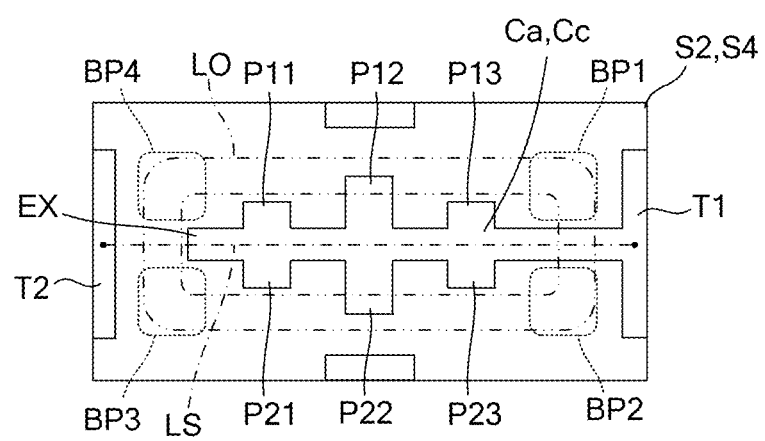
FIGS. 14A and 14B are plan views illustrating a relationship between capacitor conductor patterns and the coil conductor patterns of a phase shifter in the third preferred embodiment of the present invention.
Figure 14B:
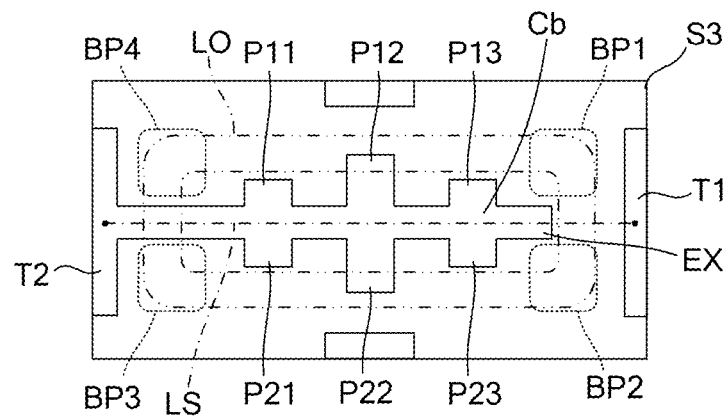

In the example illustrated in FIGS. 14A and 14B, the capacitor conductor patterns Ca, Cb, and Cc include the projecting portions P11, P12, P13, P21, P22, and P23 that project in the directions orthogonal or substantially orthogonal to the direction of the line segment LS as viewed in the lamination direction. The projecting amounts of the projecting portions P12 and P22 (the areas of the projecting portions) at the center in the direction along the line segment LS are larger than the projecting amounts of the other projecting portions P11, P13, P21, and P23. As described above, in the capacitor conductor patterns Ca, Cb, and Cc, the projecting amount is larger in the projecting portions close to the center of the line segment LS than in the projecting portions close to end portions thereof. The capacitor conductor patterns Ca, Cb, and Cc are thus provided so as to avoid positions where magnetic flux densities by the first coil conductor patterns and the second coil conductor patterns are relatively high. Therefore, the interference between the first coil conductor patterns and the second coil conductor patterns and the capacitor conductor patterns Ca, Cb, and Cc can be effectively reduced or prevented.

Figure 15A:
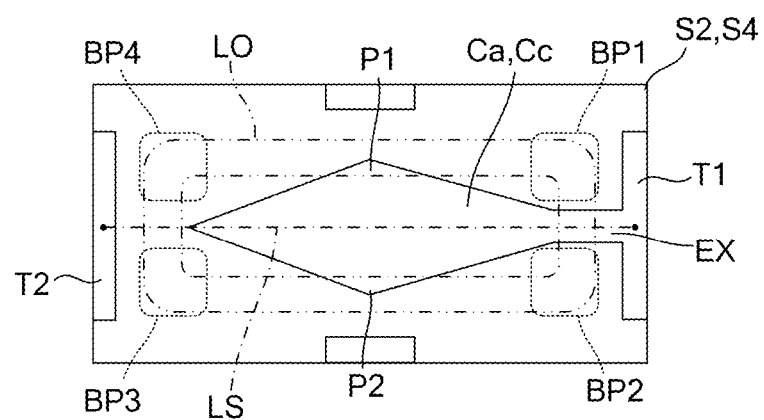
FIGS. 15A and 15B are plan views illustrating a relationship between capacitor conductor patterns and the coil conductor patterns of a phase shifter in the third preferred embodiment of the present invention.
Figure 15B:
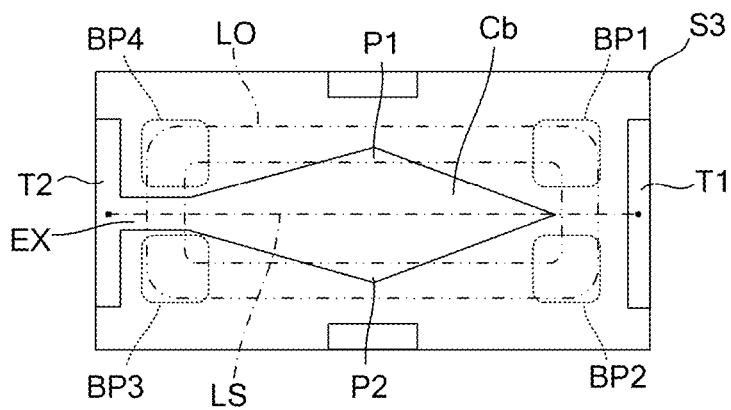

In the example illustrated in FIGS. 15A and 15B, the capacitor conductor patterns Ca, Cb, and Cc include the projecting portions P1 and P2 that project in the directions orthogonal or substantially orthogonal to the direction of the line segment LS as viewed in the lamination direction. The projecting portions P1 and P2 have widths in the direction orthogonal or substantially orthogonal to the line segment LS continuously increases from the first terminal T1 and the second terminal T2 to the center of the line segment LS. In this example, an approximate rhombic shape is provided.

In FIG. 15A, the extending portions EX of the capacitor conductor patterns Ca and Cc pass through between the bent portions BP1 and BP2, and the tip end thereof extends toward between the bent portions BP3 and BP4. In FIG. 15B, the extending portion EX of the capacitor conductor pattern Cb passes through between the bent portions BP3 and BP4, and the tip end thereof extends toward between the bent portions BP1 and BP2. With this configuration, the capacitor conductor patterns having areas as wide as possible are provided while avoiding portions where the magnetic flux densities by the first coil conductor patterns and the second coil conductor patterns are high.

Figure 16A:
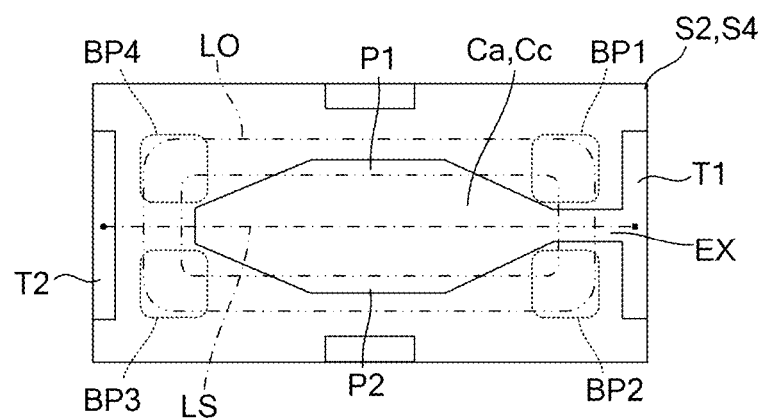
FIGS. 16A and 16B are plan views illustrating a relationship between capacitor conductor patterns and the coil conductor patterns of a phase shifter in the third preferred embodiment of the present invention.
Figure 16B:
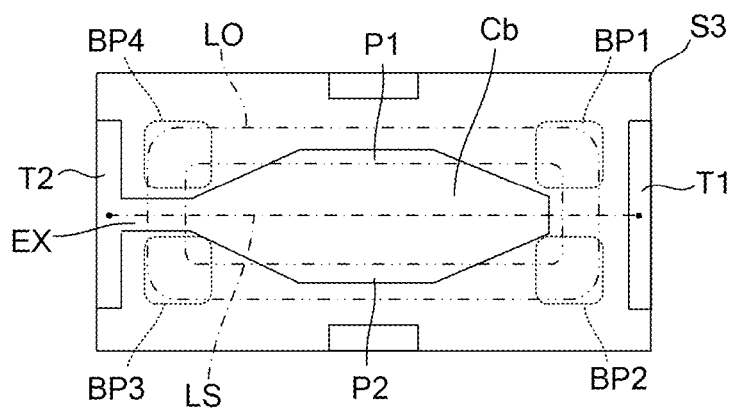

In the example illustrated in FIGS. 16A and 16B, the capacitor conductor patterns Ca, Cb, and Cc include the projecting portions P1 and P2 that project in the direction orthogonal or substantially orthogonal to the direction of the line segment LS as viewed in the lamination direction. The projecting portions P1 and P2 have widths in the direction orthogonal or substantially orthogonal to the line segment LS that continuously increase from the first terminal T1 and the second terminal T2 to the center of the line segment LS. In this example, an approximate hexagonal shape is provided. With this configuration, the capacitor conductor patterns with areas as wide as possible are provided while avoiding portions where the magnetic flux densities by the first coil conductor patterns and the second coil conductor patterns are high in the bent portions BP1, BP2, BP3, and BP4 of the first coil conductor patterns L1a to L1d and the second coil conductor patterns L2a to L2d.

Figure 17A:
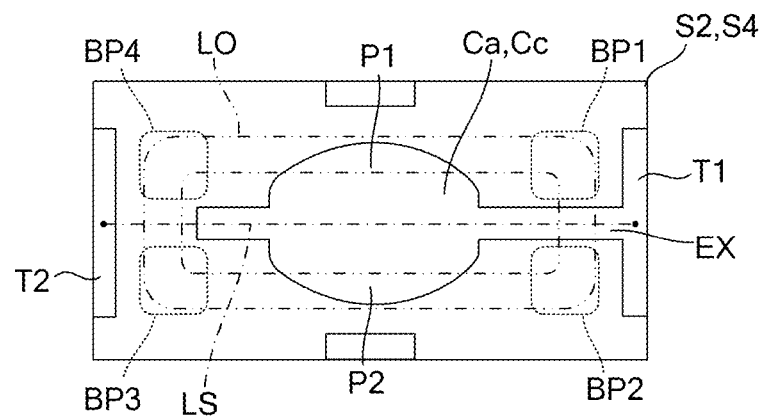
FIGS. 17A and 17B are plan views illustrating a relationship between capacitor conductor patterns and the coil conductor patterns of a phase shifter in the third preferred embodiment of the present invention.
Figure 17B:
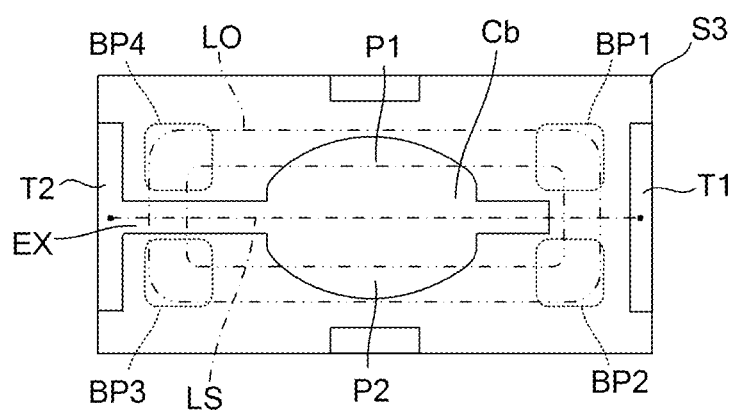

In the example illustrated in FIGS. 17A and 17B, the capacitor conductor patterns Ca, Cb, and Cc include the projecting portions P1 and P2 that project in the directions orthogonal or substantially orthogonal to the direction of the line segment LS as viewed in the lamination direction. The projecting portions P1 and P2 include portions corresponding to the center of the line segment LS that have curvatures (are rounded) as viewed in the lamination direction. With this configuration, the capacitor conductor patterns can be provided while avoiding portions having higher magnetic flux densities in comparison with the case where the projecting portions P1 and P2 have rectangular or substantially rectangular shapes (in the case of rectangular or substantially rectangular projecting portions having the same areas as those of the projecting portions P1 and P2 in FIGS. 17A and 17B).

Figure 21A:
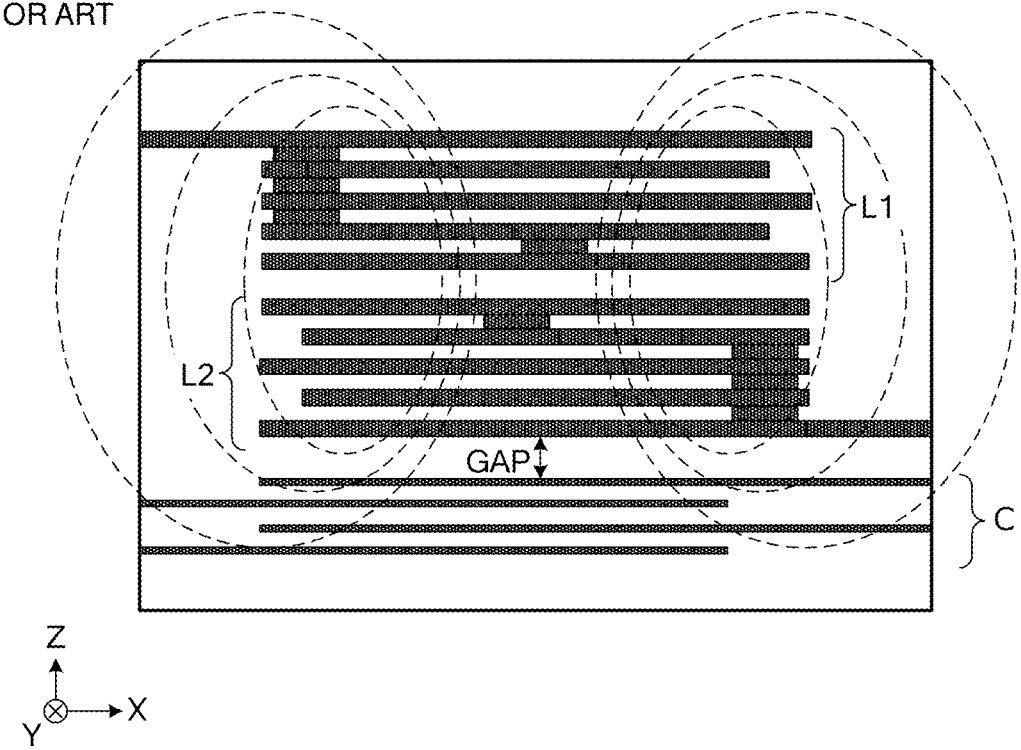
FIG. 21A is a cross-sectional view of a phase shifter that is to be configured as a multilayer chip component.
Figure 21B:
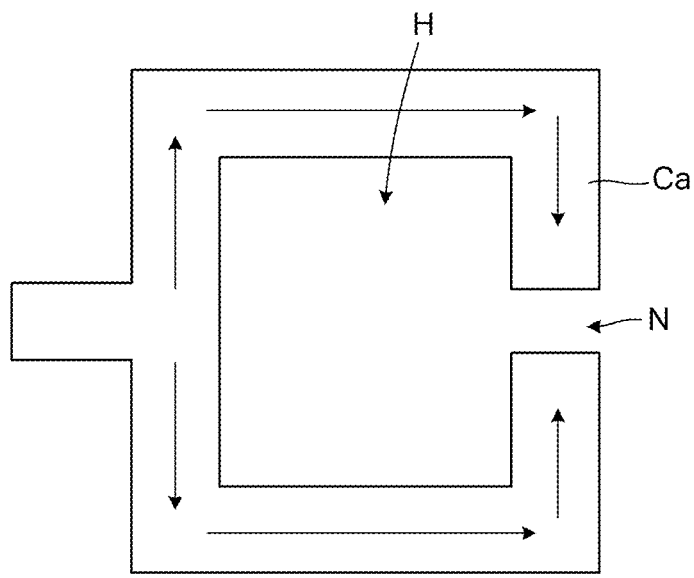
FIG. 21B is a plan view of a capacitor conductor pattern formed in a multilayer body.

In any of the above-described preferred embodiments, each of the capacitor conductor patterns Ca and Cc connected to the first terminal T1 and the capacitor conductor pattern Cb connected to the second terminal T2 includes the extending portion EX extending along the line segment connecting the center of the first terminal T1 and the center of the second terminal T2 in the shortest distance as viewed in the lamination direction, and thus current flows through the capacitor conductor patterns in the shortest path. Therefore, the effective ESL of the capacitor is smaller than that of a capacitor including an electrode opening H illustrated in FIG. 21B. An unnecessarily large inclination of the frequency characteristics of the phase shift amount is thus reduced or prevented.

Fourth Preferred Embodiment

Figure 18:
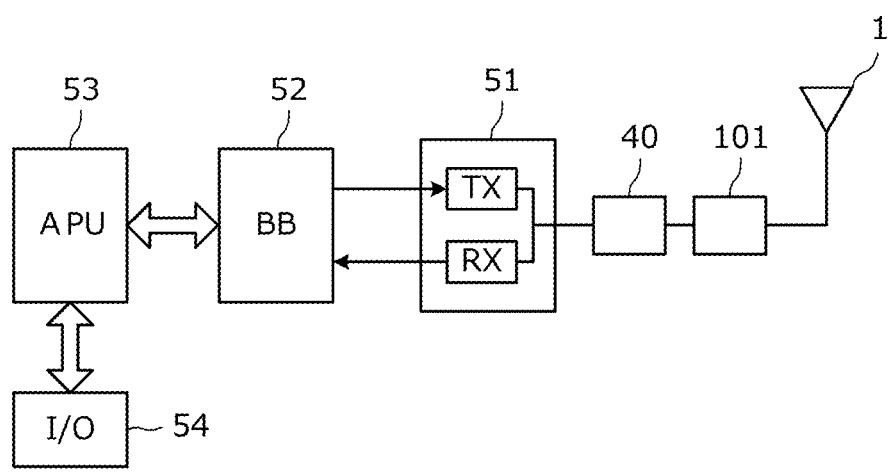
FIG. 18 is a block diagram of a communication terminal device 200 according to a fourth preferred embodiment of the present invention.
Figure 19:
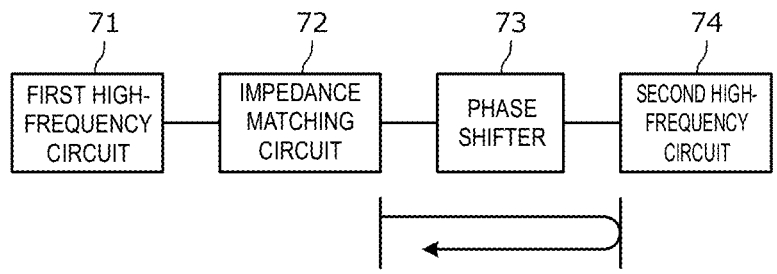
FIG. 19 is a diagram illustrating an example of the configuration of a circuit that performs impedance matching between a first high-frequency circuit 71 and a second high-frequency circuit 74.
Figure 20A:
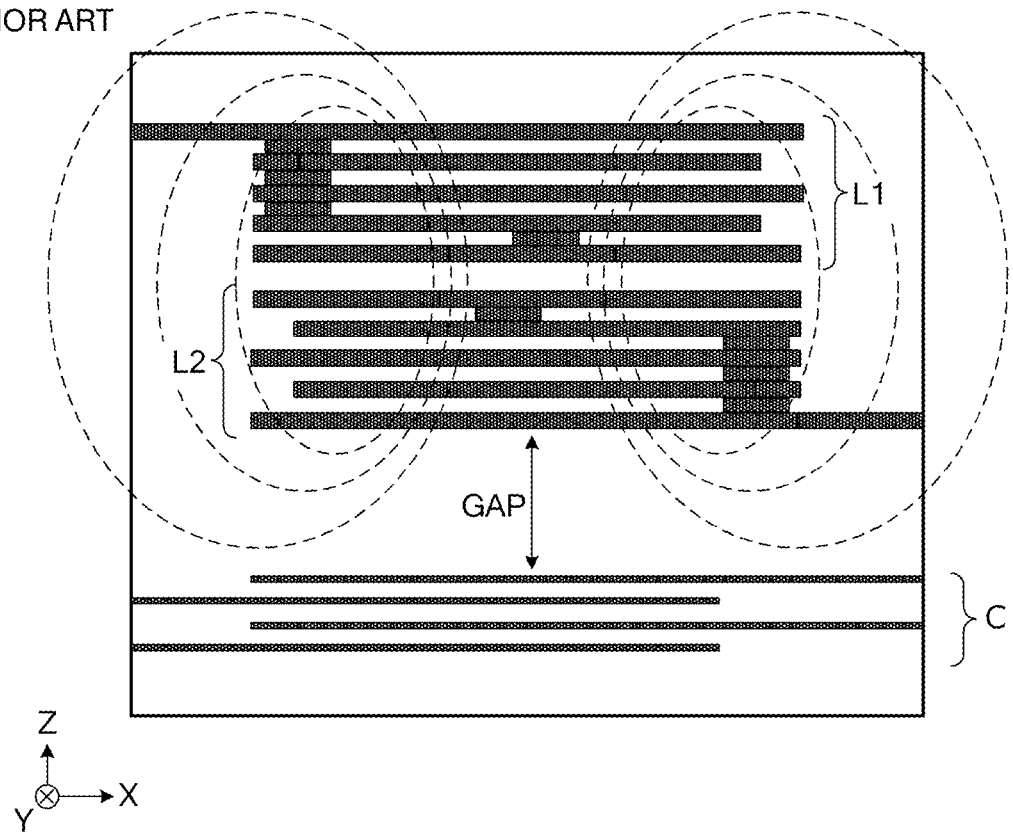
FIG. 20A is a cross-sectional view of a phase shifter that is to be configured as a multilayer chip component.
Figure 20B:
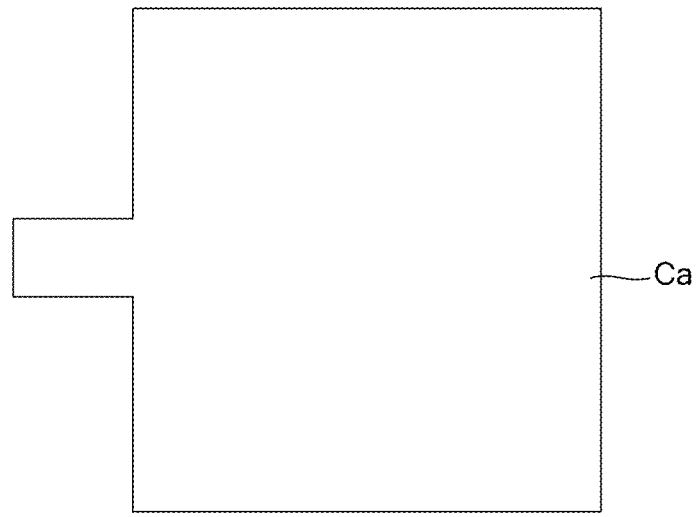
FIG. 20B is a plan view of a capacitor conductor pattern formed in a multilayer body.

In a fourth preferred embodiment of the present invention, an example of a communication terminal device will be described. FIG. 18 is a block diagram of a communication terminal device 200 in the fourth preferred embodiment. The communication terminal device 200 in the present preferred embodiment includes an antenna 1, an antenna matching circuit 40, the phase shifter 101, a communication circuit 51, a baseband circuit 52, an application processor 53, and an input/output circuit 54. The communication circuit 51 includes a transmission circuit TX and a reception circuit RX for a low band (about 700 MHz to about 900 MHz-band) and a high band (about 1.7 GHz to about 2.7 GHz-band), and an antenna duplexer. The antenna 1 is a monopole antenna corresponding to the low band and the high band, an inverted-L-type antenna, an inverted-F-type antenna, or the like, for example.

The above-described components are housed in one housing. For example, the antenna matching circuit 40, the phase shifter 101, the communication circuit 51, the baseband circuit 52, and the application processor 53 are mounted on a printed wiring board, and the printed wiring board is housed in the housing. The input/output circuit 54 is incorporated in the housing as a display/touch panel. The antenna 1 is mounted on the printed wiring board or provided on the inner surface of the housing or inside the housing.

With the above-described configuration, the communication terminal device including the antenna matching over a wide band is obtained.

Finally, the explanation of the above-described preferred embodiments is illustrative in all respects and is not restrictive. Modifications and variations can be appropriately made by those skilled in the art. The range of the present invention is indicated by the scope of the present invention rather than by the above-described preferred embodiments. Further, the range of the present invention includes variations from the preferred embodiments within an equivalent range of the scope of the present invention.

For example, although the LC composite component that includes the capacitor patterns, the first coil conductor patterns, and the second coil conductor patterns and defines and functions as the phase shifter is described in each of the above-described preferred embodiments, the present invention is not limited to the phase shifter. When, for example, an LC filter, an impedance matching circuit including an LC, and the like are provided as single components, the present invention can be similarly applied to each LC composite component in which a coil and a capacitor are provided in a single multilayer body. For example, the LC filter, the impedance matching circuit, and the like can be defined by the coil conductor pattern like the first coil conductor pattern or the second coil conductor pattern and the capacitor conductor pattern of the above-described phase shifter, and in that case, interference between the coil conductor pattern and the capacitor conductor pattern is reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC composite component comprising:
   a multilayer body including a plurality of insulating base members that are laminated, and conductor patterns respectively provided on the plurality of insulating base members; and
   a first terminal and a second terminal along two sides of the multilayer body, which face each other as viewed in a lamination direction of the plurality of insulating base members; wherein
   the conductor patterns include a coil conductor pattern and a capacitor conductor pattern;
   the coil conductor pattern includes a plurality of linear portions and a plurality of bent portions at positions winding around a coil opening;
   the capacitor conductor pattern includes a first capacitor conductor pattern that conducts to the first terminal and a second capacitor conductor pattern that conducts to the second terminal and faces the first capacitor conductor pattern in the lamination direction;
   the first capacitor conductor pattern and the second capacitor conductor pattern are provided on insulating base members different from an insulating base member on which the coil conductor pattern is provided among the plurality of insulating base members, and each of the first capacitor conductor pattern and the second capacitor conductor pattern includes an extending portion overlapping with a line segment connecting a center of the first terminal and a center of the second terminal in a shortest distance as viewed in the lamination direction and a projecting portion projecting in a direction different from a direction of the line segment; and the projecting portions of the first and second capacitor conductor patterns overlap with the plurality of linear portions of the coil conductor pattern and does not overlap with the plurality of bent portions of the coil conductor pattern as viewed in the lamination direction.

2. The LC composite component according to claim 1, wherein at least one of the projecting portions includes a portion corresponding to a center of the line segment that has a curvature as viewed in the lamination direction.

3. The LC composite component according to claim 1, wherein a plurality of the projecting portions are provided.

4. The LC composite component according to claim 1, further comprising:
another coil conductor pattern; wherein
the coil conductor pattern and the another coil conductor pattern have a common winding axis;
a straight line indicating a projecting direction of the corresponding projecting portion includes a straight line passing through a center of the line segment as viewed in the lamination direction; and
the center of the line segment is closer to the winding axis than the plurality of bent portions of the coil conductor pattern as viewed in the lamination direction.

5. The LC composite component according to claim 1, wherein a width of the capacitor conductor pattern in a direction orthogonal or substantially orthogonal to the line segment is smaller in a portion that is directly connected to the first terminal or the second terminal than in at least one of the projecting portions.

6. The LC composite component according to claim 1, wherein the capacitor conductor pattern is symmetrical or substantially symmetrical with respect to the line segment.

7. The LC composite component according to claim 1, wherein at least one of the projecting portions projects linearly in a direction orthogonal or substantially orthogonal to the line segment as viewed in the lamination direction.

8. The LC composite component according to claim 1, wherein at least one of the projecting portions has a width in a direction orthogonal or substantially orthogonal to the line segment that increases continuously from the first terminal and the second terminal to a center of the line segment as viewed in the lamination direction.

9. The LC composite component according to claim 1, further comprising:
a ground terminal on the multilayer body; wherein
the coil conductor pattern includes a first coil conductor pattern defining a first coil and a second coil conductor pattern defining a second coil that provides magnetic field coupling with the first coil;
the first coil is connected between the first terminal and the ground terminal; and
the second coil is connected between the second terminal and the ground terminal.

10. A communication terminal device comprising:
a power supply circuit; and
an antenna connected to the power supply circuit; wherein
the LC composite component according to claim 9 is provided between the power supply circuit and the antenna.

11. A communication terminal device comprising:
two input/output terminals;
a signal line connecting the two input/output terminals; and a series circuit of the LC composite component according to claim 9; and
an LC resonance circuit in a shunt connection path between the signal line and ground.

12. The communication terminal device according to claim 11, further comprising an amplifier connected to the signal line.

13. An LC composite component comprising:
a multilayer body including a plurality of insulating base members that are laminated, and conductor patterns respectively provided on the plurality of insulating base members; and
a first terminal and a second terminal along two sides of the multilayer body, which face each other as viewed in a lamination direction of the plurality of insulating base members; wherein
the conductor patterns include a coil conductor pattern and a capacitor conductor pattern;
the coil conductor pattern includes a plurality of linear portions and a plurality of bent portions at positions winding around a coil opening;
the capacitor conductor pattern includes a first capacitor conductor pattern that conducts to the first terminal and a second capacitor conductor pattern that conducts to the second terminal and faces the first capacitor conductor pattern in the lamination direction;
the first capacitor conductor pattern and the second capacitor conductor pattern are provided on insulating base members different from an insulating base member on which the coil conductor pattern is provided among the plurality of insulating base members, and each of the first capacitor conductor pattern and the second capacitor conductor pattern includes an extending portion overlapping with a line segment connecting a center of the first terminal and a center of the second terminal in a shortest distance as viewed in the lamination direction and a projecting portion projecting in a direction different from a direction of the line segment;
the direction different from the direction of the line segment extends parallel or substantially parallel to a surface of the insulating base members on which the first and second capacitor conductor patterns are provided; and
the projecting portions of the first and second capacitor conductor patterns are closer to the plurality of linear portions of the coil conductor pattern than to the plurality of bent portions as viewed in the lamination direction.

14. The LC composite component according to claim 13, wherein a plurality of the projecting portions are provided.

15. The LC composite component according to claim 13, further comprising:
another coil conductor pattern; wherein
the coil conductor patterns and the another coil conductor pattern have a common winding axis;
a straight line indicating a projecting direction of the corresponding projecting portion includes a straight line passing through a center of the line segment as viewed in the lamination direction; and
the center of the line segment is closer to the winding axis than the plurality of bent portions of the coil conductor pattern as viewed in the lamination direction.

16. The LC composite component according to claim 13, wherein a width of the capacitor conductor pattern in a direction orthogonal or substantially orthogonal to the line segment is smaller in a portion that is directly connected to the first terminal or the second terminal than in at least one of the projecting portions.

17. The LC composite component according to claim 13, wherein the capacitor conductor pattern is symmetrical or substantially symmetrical with respect to the line segment.

18. The LC composite component according to claim 13, wherein at least one of the projecting portions projects linearly in a direction orthogonal or substantially orthogonal to the line segment as viewed in the lamination direction.

19. The LC composite component according to claim 13, wherein at least one of the projecting portions has a width in a direction orthogonal or substantially orthogonal to the line segment that increases continuously from the first terminal and the second terminal to a center of the line segment as viewed in the lamination direction.

20. The LC composite component according to claim 13, wherein at least one of the projecting portions includes a portion corresponding to a center of the line segment that has a curvature as viewed in the lamination direction.

21. The LC composite component according to claim 13, further comprising:
- a ground terminal on the multilayer body; wherein
- the coil conductor pattern includes a first coil conductor pattern defining a first coil and a second coil conductor pattern defining a second coil that provides magnetic field coupling with the first coil;
- the first coil is connected between the first terminal and the ground terminal; and
- the second coil is connected between the second terminal and the ground terminal.

* * * * *